United States Patent
Teo et al.

(10) Patent No.: US 8,274,115 B2
(45) Date of Patent: Sep. 25, 2012

(54) HYBRID ORIENTATION SUBSTRATE WITH STRESS LAYER

(75) Inventors: Lee Wee Teo, Singapore (SG); Chung Woh Lai, Singapore (SG); Johnny Widodo, Singapore (SG); Shyue Seng Tan, Singapore (SG); Shailendra Mishra, The Woodsvale (SG); Zhao Lun, Singapore (SG); Yong Meng Lee, Singapore (SG); Jeffrey Chee, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 531 days.

(21) Appl. No.: 12/050,956

(22) Filed: Mar. 19, 2008

(65) Prior Publication Data
US 2009/0236663 A1 Sep. 24, 2009

(51) Int. Cl.
*H01L 27/12* (2006.01)
(52) U.S. Cl. .................. 257/347; 438/150
(58) Field of Classification Search ............... 438/150
See application file for complete search history.

(56) References Cited

U.S. PATENT DOCUMENTS

| | | | |
|---|---|---|---|
| 6,251,754 B1 | 6/2001 | Ohshima et al. | |
| 6,635,543 B2 | 10/2003 | Furukawa et al. | |
| 7,651,902 B2 * | 1/2010 | Cannon et al. | 438/199 |
| 2006/0024931 A1 | 2/2006 | Chan et al. | |
| 2006/0131699 A1 | 6/2006 | Raab et al. | |
| 2006/0292770 A1 | 12/2006 | Wu et al. | |
| 2007/0048919 A1 | 3/2007 | Adetutu et al. | |
| 2007/0122965 A1 * | 5/2007 | Chidambarrao et al. | 438/219 |
| 2008/0044967 A1 * | 2/2008 | Teh et al. | 438/199 |
| 2008/0096330 A1 * | 4/2008 | Doris et al. | 438/150 |
| 2008/0164530 A1 * | 7/2008 | Wang et al. | 257/369 |

* cited by examiner

*Primary Examiner* — David Vu
*Assistant Examiner* — Caleb Henry
(74) *Attorney, Agent, or Firm* — Horizon IP Pte Ltd

(57) ABSTRACT

A hybrid orientation substrate includes a base substrate having a first orientation, a first surface layer having a first orientation disposed on the base substrate in a first region, and a second surface layer disposed on the base substrate in a second region. The second surface layer has an upper sub-layer having a second orientation, and a lower sub-layer between the base substrate and the upper sub-layer. The lower sub-layer having a first stress induces a second stress on the upper sub-layer.

16 Claims, 9 Drawing Sheets

205

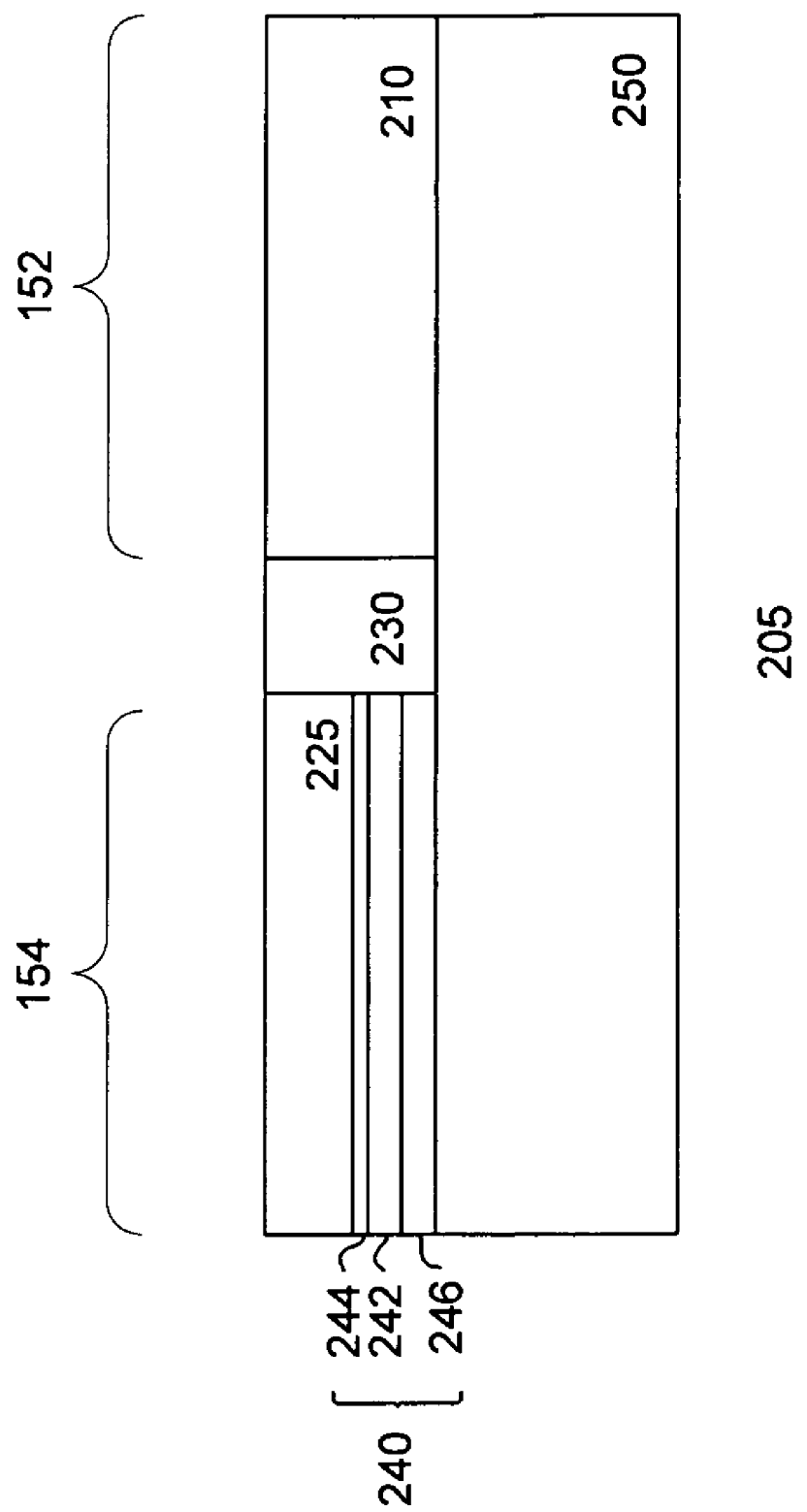

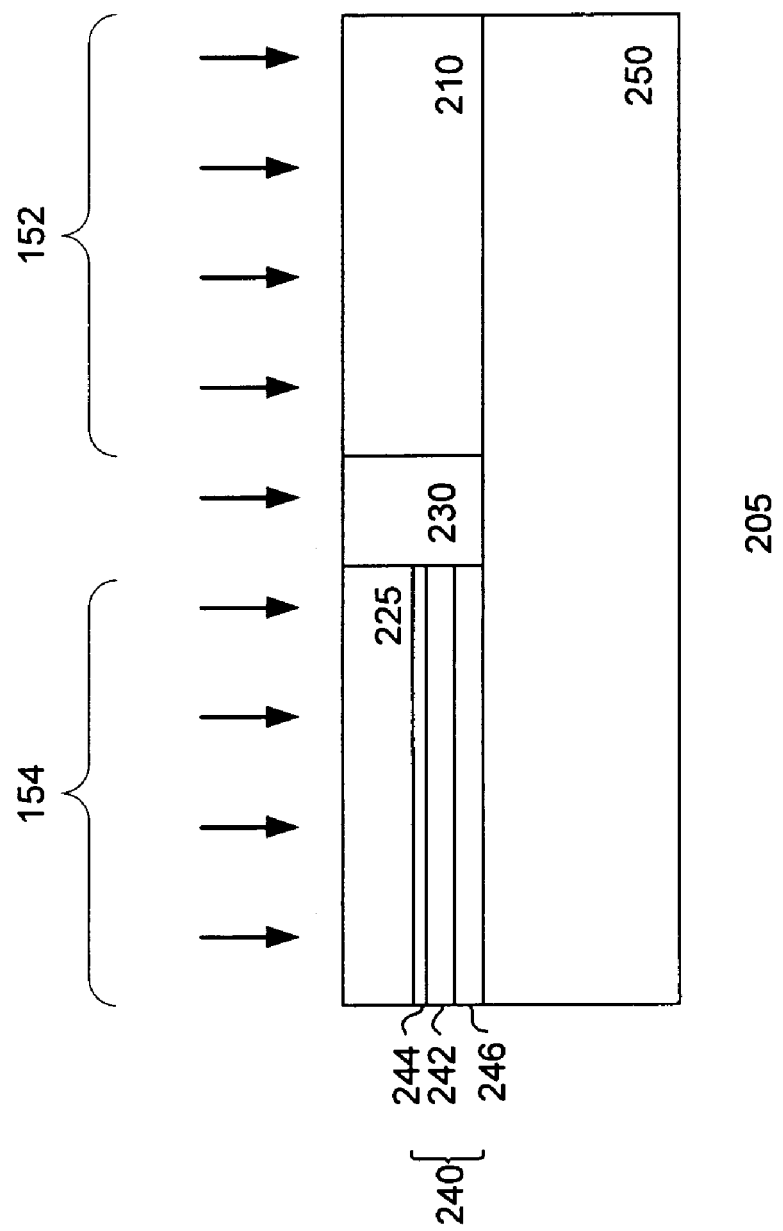

HYBRID ORIENTATION SUBSTRATE WITH STRESS LAYER

FIELD OF THE INVENTION

The present invention relates generally to integrated circuits, and more particularly to hybrid orientation substrates for complementary metal oxide semiconductor (CMOS) applications.

BACKGROUND OF THE INVENTION

Complementary metal oxide semiconductor (CMOS) circuits comprise both n-type and p-type transistors, for example, n-type field effect transistors (nFETs) and p-type field effect transistors (pFETs). NFETs utilize electron carriers and pFETs utilize hole carriers. High carrier mobility is desired to provide transistors with, for example, fast switching speed. Typically, CMOS circuits are formed on silicon substrates having a (100) surface orientation. Carrier mobility, however, is affected by the surface orientation of the substrate. For example, electrons have high mobility in substrates with (100) surface orientation and holes have high mobility in substrates with (110) surface orientation. This undesirably results in the performance of pFETs being negatively impacted.

From the foregoing discussion, it is desirable to provide substrates which provide high carrier mobility for different types of carriers, such as electrons and holes.

SUMMARY OF THE INVENTION

The present invention relates to hybrid orientation substrates for CMOS applications. In one aspect of the invention, a hybrid orientation substrate comprises a base substrate having a first orientation, a first surface layer disposed on the base substrate in a first region, and a second surface layer disposed on the base substrate in a second region. The first surface layer has the first orientation. The second surface layer comprises an upper sub-layer having a second orientation, and a lower sub-layer between the base substrate and the upper sub-layer. The lower sub-layer having a first stress induces a second stress on the upper sub-layer.

In another aspect of the invention, an IC comprises a hybrid orientation substrate is provided. The hybrid orientation substrate comprises a first region of the substrate having a first substrate orientation, and a second region of the substrate having a second substrate orientation. The first and second regions are electrically isolated by an isolation region. The hybrid orientation substrate further comprises a stress layer adjacent to the second region, and a field effect transistor (FET) formed in the second region. The stress layer having a first stress induces a second stress in the second region to increase carrier mobility of the FET.

In yet another aspect of the invention, a method of fabricating a hybrid orientation substrate comprises providing a substrate. The substrate comprises a first region having a first substrate orientation, and a second region having a second substrate orientation. The first and second regions are electrically isolated by an isolation region. The substrate further comprises a stress layer adjacent to the second region having a neutral or moderate tensile stress. The method further comprises subjecting the substrate to ultra-violet (UV) treatment to convert the stress layer to a high tensile stress layer. In an alternative embodiment, the method includes subjecting the substrate to high temperature annealing (HTA) to convert the stress layer to a high tensile stress layer.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Various embodiments of the present invention are described with reference to the following drawings, in which:

FIGS. 2a-g illustrate a process flow for forming a hybrid orientation substrate in accordance with one embodiment of the invention.

DETAILED DESCRIPTION OF THE INVENTION

The present invention relates to ICs. More particularly, the present invention relates to hybrid orientation substrates. Hybrid orientation substrates comprise at least first and second regions having first and second crystal orientations. The different orientations are provided to increase carrier mobility of different transistors, such as p-type and n-type transistors. The invention can be applied to various types of ICs, such as memory devices including dynamic random access memories (DRAMs), static random access memories (SRAMs), non-volatile memories including programmable read-only memories (PROM) and flash memories, optoelectronic devices, logic devices, communication devices, digital signal processors (DSPs), microcontrollers, system-on-chip, as well as other types of devices.

Figure 1:
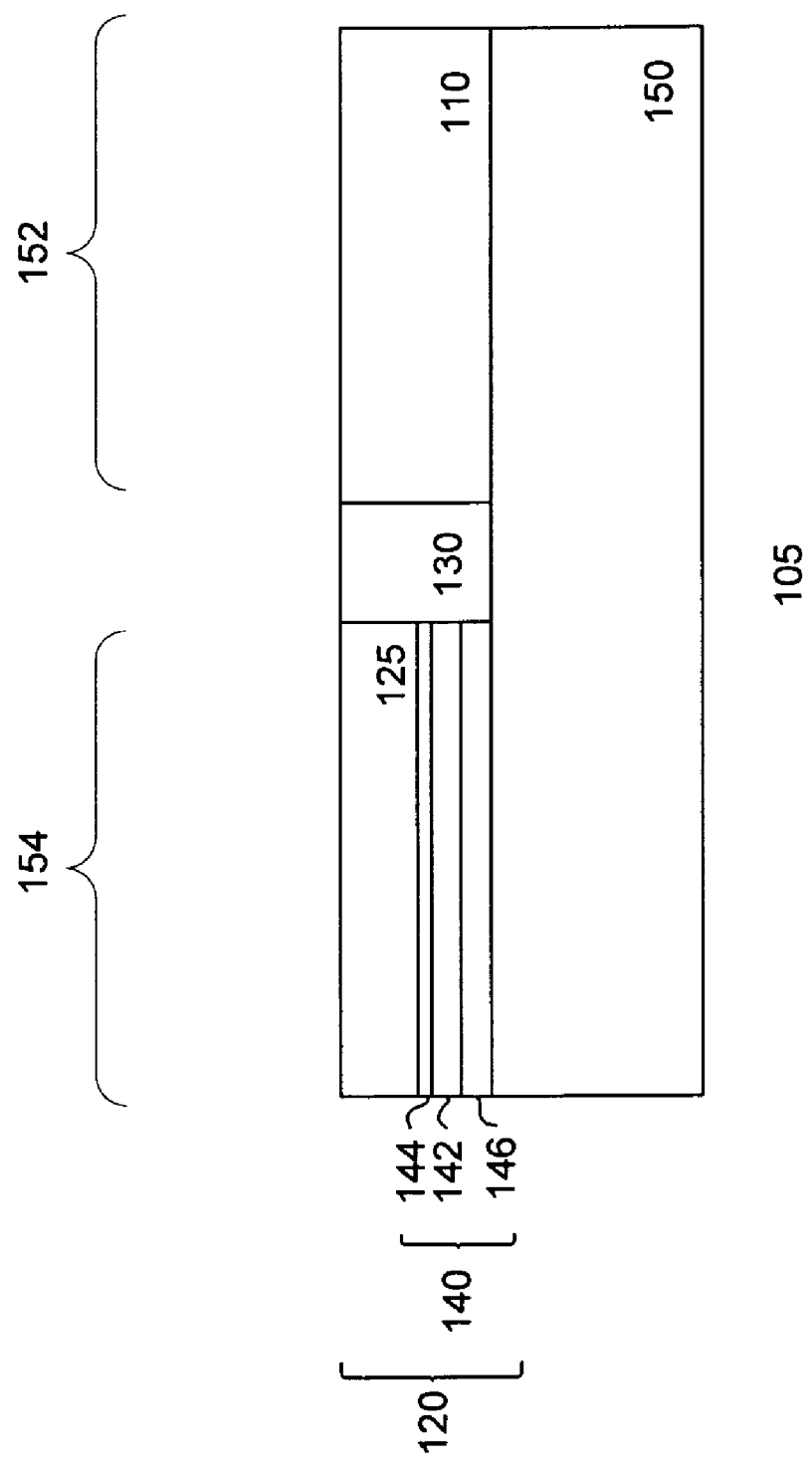
FIG. 1 shows a cross-section of portion of a hybrid orientation substrate in accordance with one embodiment of the invention.

FIG. 1 shows a cross-sectional view of a portion of a hybrid orientation substrate 105 in accordance with one embodiment of the invention. The substrate comprises a base substrate 150 of a semiconductor material. In one embodiment, the base substrate comprises silicon. Other types of semiconductor materials or substrates, for example, SiGe, SiGeC or SiC, are also useful. Providing substrates which include an insulation or buffer layer, such as silicon-on-insulators (SOIs), SiGe-on-insulators (SGOIs), silicon-on-nothing (SON), is also useful. The base substrate comprises a first crystal orientation.

First and second active regions 152 and 154 are defined on the base substrate. Disposed on the base substrate in the first and second active regions are first and second surface layers 110 and 120. The first surface layer comprises a semiconductor material with a first crystal orientation. Preferably, the surface layer comprises the same material as the base substrate. In one embodiment, the first surface layer comprises an epitaxial layer. As for the second surface layer, it comprises a plurality of sub-layers. As shown, the second surface layer comprises an upper or first sub-layer 125 and a lower or second sub-layer 140. The upper sub-layer comprises a semiconductor material having a second crystal orientation.

The second sub-layer is disposed between the first sub-layer and the base substrate, forming an embedded layer. The second sub-layer comprises a stress inducing material. The stress inducing material comprises a first stress which induces a second stress on the first sub-layer above. In one embodiment, the stress inducing material comprises a tensile stress material, inducing a compressive stress on the first sub-layer. Preferably, the stress inducing material comprises a high tensile stress. Providing a stress inducing layer which comprises other types of stress is also useful. Various types of stress inducing materials can be used. For example, the stress inducing material comprises a dielectric stress inducing material such as silicon nitride. Other types of stress inducing materials are also useful.

In one embodiment, the second sub-layer comprises a composite sub-layer, having a plurality of buried layers. The second sub-layer comprises first and second pad buried layers 144 and 146 sandwiching a stress inducing layer 142. The second pad layer acts as a buffer layer to avoid direct contact between the stress inducing layer and the base substrate, which can cause high stress on the surface of the base substrate. The pad layers also serve to improve adhesion between the stress inducing layer and the base substrate and/or any overlying layer(s). The pad layers comprise, for example, a dielectric material, such as silicon oxide. Other types of pad layers are also useful. In one embodiment, the pad layers comprise silicon oxide while the stress inducing layer comprises silicon nitride. Other configurations of buried layers are also useful.

The surface layers are coplanar and should be sufficiently thick to serve as active regions for the transistors. The thickness of the surface layers should take into consideration of the embedded stress layer of the second surface layer. For example, the surface layers are about 100-2500 Å thick, with the upper sub-layer of the second surface layer of about 50-1000 Å thick. The stress inducing layer should be sufficiently thick to induce the desired stress on the upper sub-layer. In general, the thicker the stress layer, the greater the stress induced. In one embodiment, the second sub-layer is about 500 Å thick, with the first and second pad layers each being about 100 Å thick, and the stress inducing layer being about 500 Å thick. Other thicknesses may also be useful.

The first and second regions serve as active regions on which first and second transistors are formed. The first transistor comprises a first transistor type with a first carrier type; the second transistor comprises a second transistor type with a second carrier type. Although the portion of the IC shows only one first and one second regions, the IC can include a plurality of first and second regions. The plurality of first regions and second regions can have various configurations, for example, contiguous, non-contiguous or a combination thereof. The crystal orientation in the surface layers enhances carrier mobility of the first and second transistors. The stress inducing layer of the second surface layer further enhances carrier mobility of the second transistor.

Isolation regions 130 separate the first and second semiconductor regions. Generally, isolation regions are provided to isolate active device regions from other active device regions. The isolation regions comprise, for example, shallow trench isolation (STI) regions. A STI comprises a trench formed in the substrate and filled with dielectric material, such as silicon oxide. Other types of isolation regions are also useful. The isolation regions are sufficiently deep to prevent, for example, punch through. The depth of the isolation regions is preferably greater than the depth of the surface layer. Other depths are also useful.

In one embodiment, the first orientation comprises (001) and the second orientation comprises (110); the first transistor type comprises a n-type transistor with electron carriers and the second transistor type comprises p-type transistors with hole carriers. Providing other orientations for first and second orientations is also useful. The stress inducing layer, in one embodiment, comprises a tensile stress inducing layer to enhance hole mobility in the (110) oriented upper sub-layer of the second surface layer. Other combination of stress and orientations are also useful.

Figure 2A:
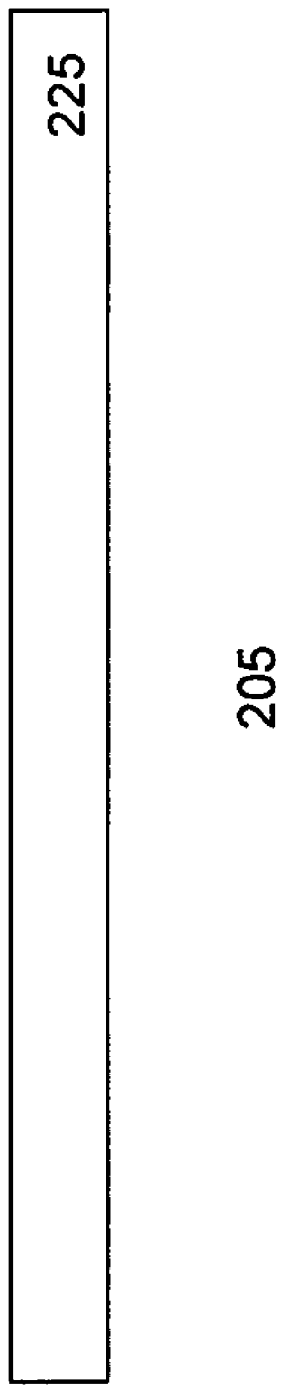

FIGS. 2a-g show a process for forming a hybrid orientation substrate 205 in accordance with one embodiment of the invention. As shown in FIG. 2a, a surface substrate 225 is provided. The surface substrate comprises a semiconductor material. In one embodiment, the surface substrate comprises silicon. Other types of semiconductor materials or substrates, for example, SiGe, SiGeC and SiC, are also useful. The surface substrate comprises a second crystal orientation. In one embodiment, the surface substrate comprises a (110) orientation. Other orientations are also useful. The surface substrate serves as the upper sub-layer of the second surface layer on which transistors of a second type are formed. The second type transistors, for example, comprise p-type transistors. Typically, the surface substrate is about 500 Å thick. Other thicknesses are also useful.

Figure 2B:
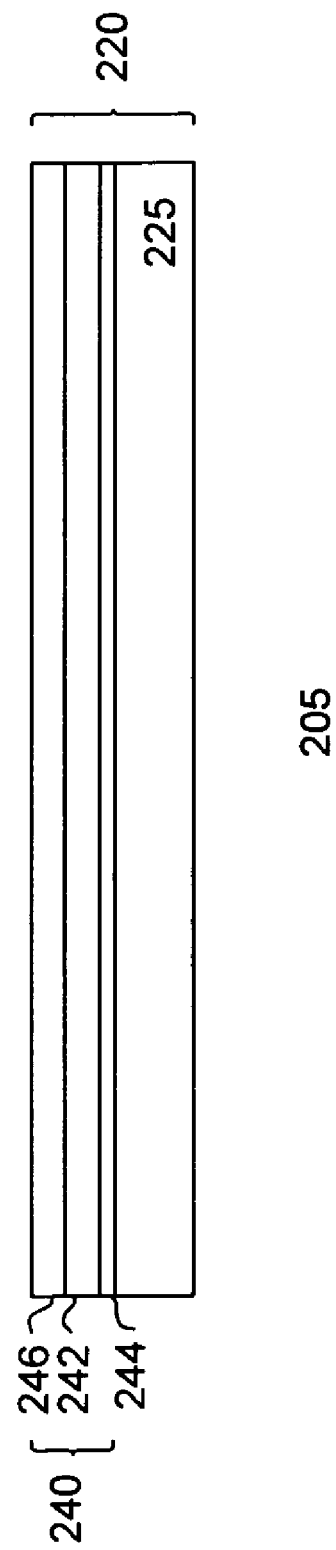

Referring to FIG. 2b, the surface substrate is processed to form a stress inducing stack 240 comprising a first stress for inducing a second stress on the surface substrate. As shown, stress inducing stack comprises a plurality of layers. In one embodiment, the stress inducing stack 240 comprises a stress inducing layer 242 between first and second pad layers 244 and 246. The surface substrate and stress inducing stack form a substrate stack which serves as a second surface layer 220 of the hybrid orientation substrate.

To form the stress inducing stack, the first pad layer is formed on the surface substrate. The first pad layer comprises, for example, a dielectric material. Other types of materials are also useful. In one embodiment, the pad layer comprises an oxide or oxynitride. Typically, the pad layer is formed by thermal oxidation and has a thickness of about 50-150 Å. Other techniques for forming the pad layer as well as thicknesses are also useful. The pad layer acts as a buffer layer to prevent direct contact between the subsequently formed stress inducing layer and the surface substrate. Direct contact can cause high stress on the surface of the surface substrate. The pad layer also improves adhesion between the two layers.

A stress inducing layer is deposited on the first pad layer, serving as an embedded stress layer. In one embodiment, the stress inducing layer comprises a first stress which induces a second stress on the surface substrate above. In one embodiment, the stress inducing layer comprises a tensile stress, inducing a compressive stress on a (110) oriented surface substrate. Inducing other types of stress or providing other orientated surface substrates is also useful. The stress inducing layer comprises silicon nitride. Preferably, the stress inducing layer comprises a material which can alter its stress property after stress treatment. The stress treatment can include, for example, UV or thermal treatment. Other types of stress treatment are also useful. In one embodiment, the stress inducing layer comprises a neutral or low stress when deposited. For example, the as deposited stress layer comprises a neutral or low tensile stress of up to about 800 MPa.

Various conventional techniques can be used to form the stress layer. For example, the stress layer can be formed using chemical deposition techniques, such as low pressure CVD (LPCVD), plasma enhanced CVD (PECVD), rapid thermal CVD (RTCVD), bis-(tertiary-butylamino)silane (BTBAS)-based CVD, or hollow cathode deposition (HCD). Other techniques are also useful. The stress layer, in accordance with one embodiment of the invention, is deposited by LPCVD, PECVD or HCD. Generally, the level of Si—N and/or Si—H bonding in the stress layer determines its stress characteristics. The higher the bonding level, the higher the stress. Preferably, the stress layer, as deposited, should have a low level of bonding so as to produce a neutral or low stress material. For example, the as deposited stress layer should have a neutral or tensile stress. In one embodiment, the thickness of the silicon nitride stress layer is about 300-1000 Å. Other thicknesses are also useful.

The second dielectric layer is formed over the stress inducing layer. In one embodiment, the second dielectric layer comprises silicon oxide. The second dielectric layer serves to improve adhesion between the stress layer and any overlying layer(s). Typically the second dielectric layer is deposited by CVD and has a thickness of about 50-150 Å. Other deposition techniques or thicknesses are also useful.

Figure 2C:
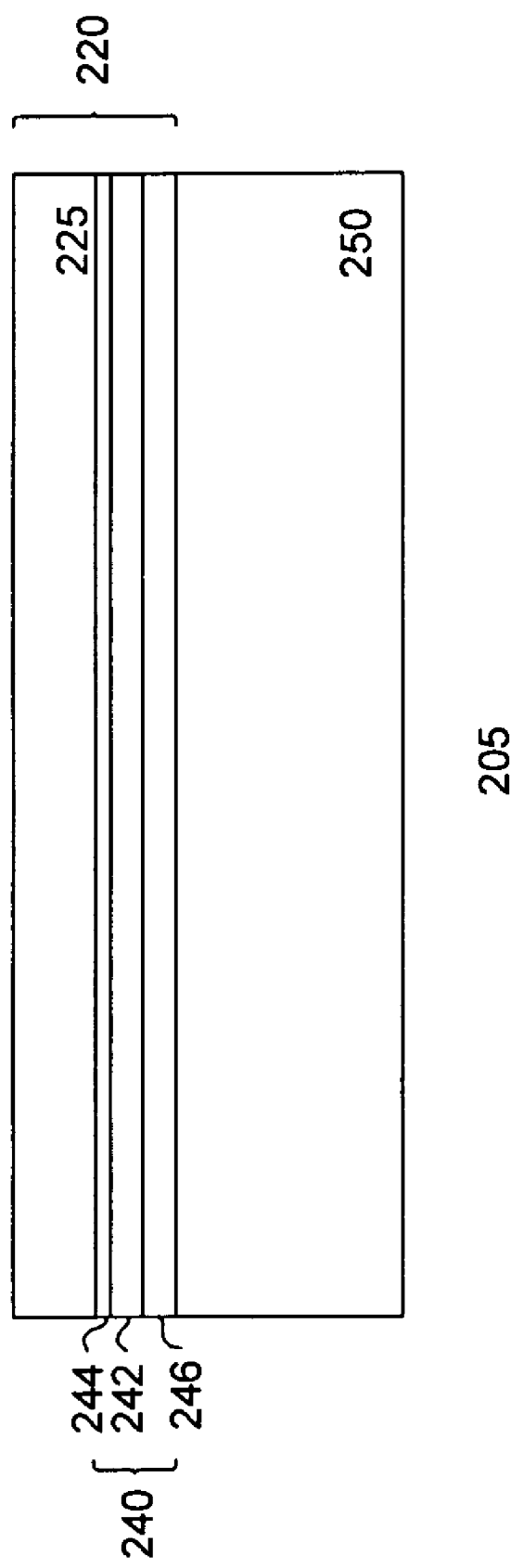

Referring to FIG. 2c, a base substrate 250 is provided. The base substrate comprises a semiconductor material. In one embodiment, the base substrate comprises silicon. Other types of semiconductor materials, such as SiGe, SiGeC and SiC, are also useful. Preferably, the base substrate comprises the same material as the surface substrate 225. Providing base substrate having an insulating or buffer layer, such as silicon-on-insulators (SOIs), SiGe-on-insulators (SGOIs) and silicon-on-nothing (SON), is also useful. The base substrate comprises a first crystal orientation. In one embodiment, the first orientation comprises (001). Other orientations are also useful.

The substrate stack 220 is bonded to the base substrate. As shown, the silicon oxide of the substrate stack is bonded to the base substrate. Conventional wafer bonding processes can be used to bond the second surface layer to the base substrate. Wafer bonding can be achieved by, for example, bringing the surface of the stack structure having the second oxide layer into close contact with the base substrate and heating the wafers. Pressure may be applied to facilitate bonding. For example, wafer bonding may be achieved in an inert ambient by applying an elevated temperature of about 750° C. for about 2 hours.

In some cases, the thickness of the surface substrate may be reduced. For example, for handling purposes, the surface substrate may be thicker than desired to provide mechanical stability. After bonding, the thickness is reduced to the desired thickness. Typically, the thickness of the surface substrate is reduced to about 500 Å. Other thicknesses are also useful. Various conventional processes, such as grinding or cutting, can be used to reduce the thickness. Preferably, the thickness of the surface substrate is reduced by chemical mechanical polishing (CMP). Other techniques to reduce the surface of the substrate are also useful.

Figure 2D:
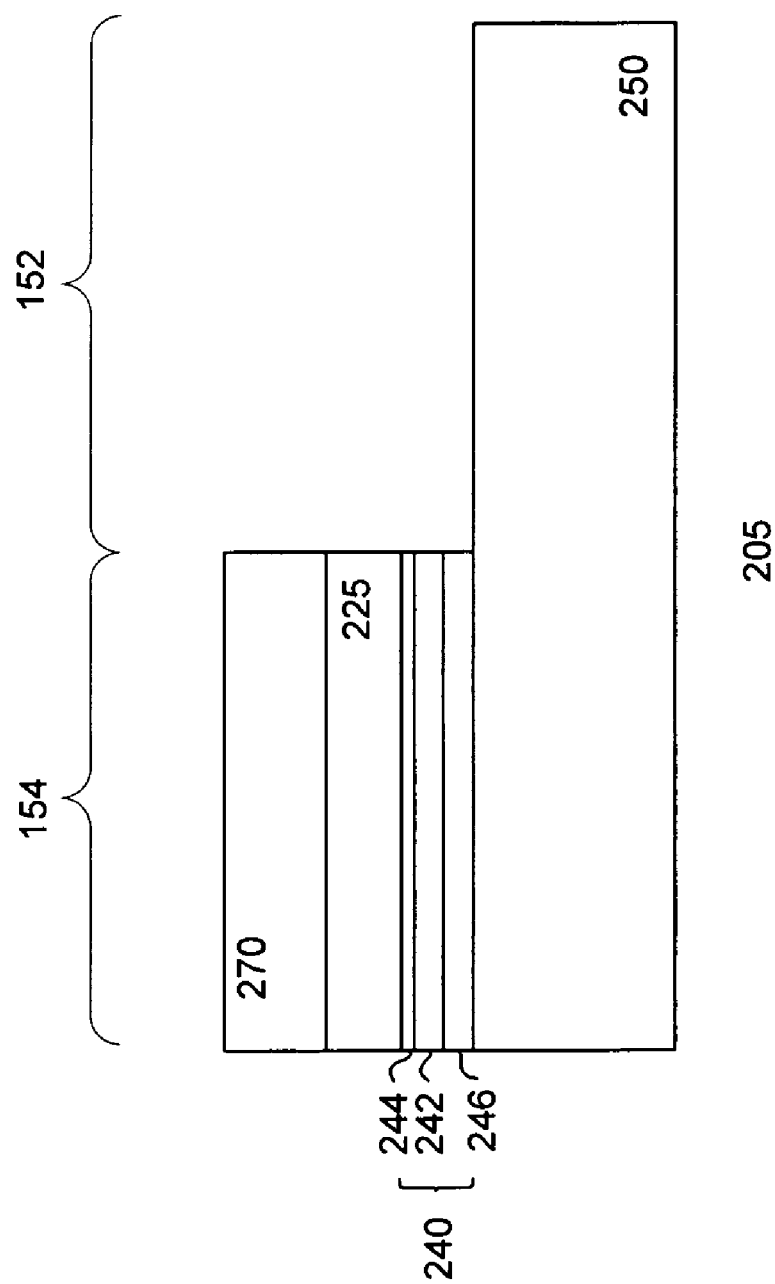

As shown in FIG. 2d, first and second active regions are defined. Portions of the second surface layer are removed from the first active region, exposing the surface of the base substrate. For example, a photoresist layer 270 is deposited on the second surface layer and patterned. The patterned photoresist layer exposes portions of the second surface layer in the first region. Exposed portions of the second surface layer are removed by, for example, an isotropic etch, such as reactive ion etch (RIE). Other techniques for patterning the second surface layer are also useful. For example, hard mask techniques may also be used. Spacers (not shown) may optionally be formed on the sidewalls of the substrate stack to protect it during subsequent processes.

Figure 2E:
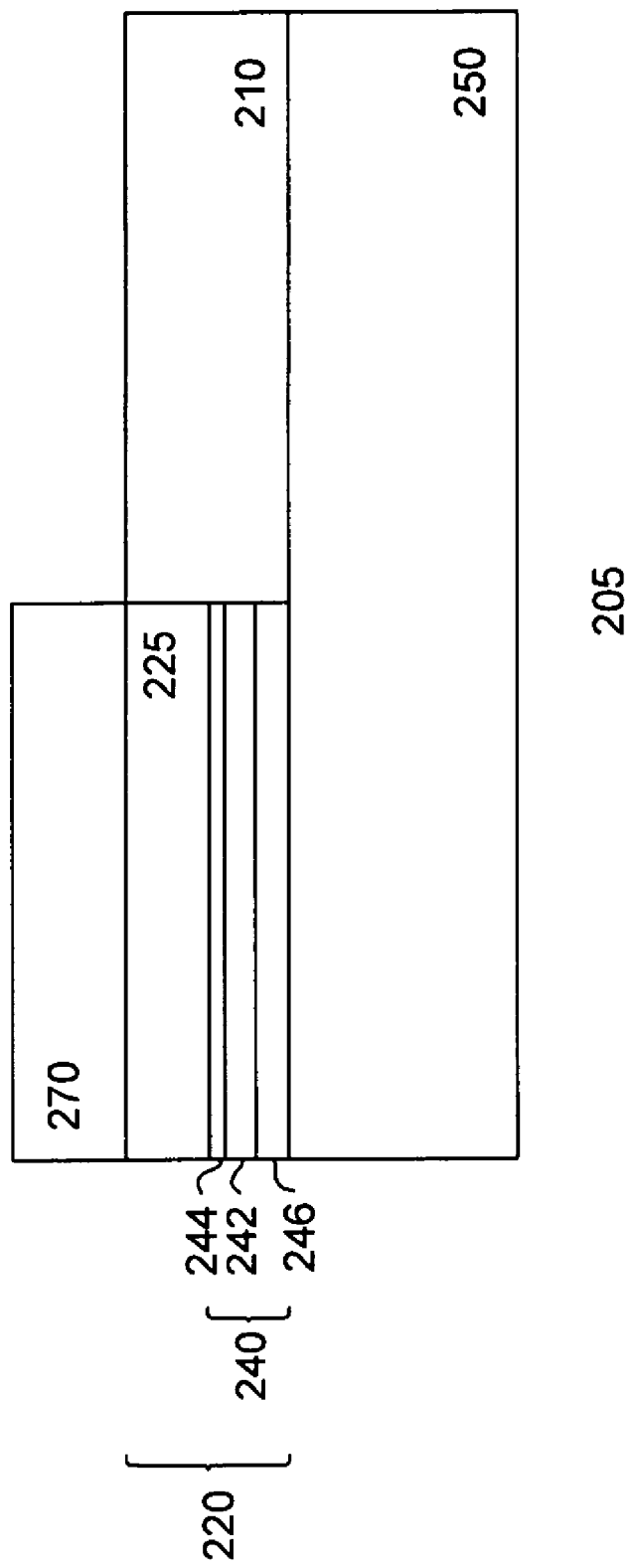

Referring to FIG. 2e, the exposed surface of the substrate is prepared. Preparation of the surface can include a clean treatment such as SC1/SC2 etching (or RCA cleaning), followed by HF cleaning to remove any native oxide. A first surface layer 210 is formed on the exposed substrate surface. In one embodiment, the first surface layer is formed by epitaxial growth. Preferably, the first surface layer is formed by selective epitaxial growth. In one embodiment, selective epitaxial growth of the first surface layer is performed by heating the base substrate to about 700-1000° C. for about 0.5-2 hrs. Using the photoresist layer as a mask, first surface layer is selectively formed on the exposed base substrate in the first region. Preferably, the first layer comprises the same material and orientation (e.g., first orientation) as the base substrate. Forming the first layer with other materials or orientations is also useful. The first surface layer is formed with a thickness equal to about thickness of the substrate stack.

After the first surface layer is formed, the photoresist layer is removed. The substrate can be polished by, for example, chemical mechanical polish (CMP) to produce first and second surface layers with coplanar top surfaces.

As shown in FIG. 2f, a STI 230 is formed between the first and second surface layers, isolating the first and second active regions. Other STIs (not shown) are also formed to isolate the active regions from other active regions. Various conventional techniques can be employed to form the STI. In one embodiment, the STI is formed by creating a trench in the substrate using conventional patterning processes, such as masking and anisotropic etching. Typically, the depth of the trench is about 2000 Å. Other depths are also useful. The trench is then filled with a dielectric material such as silicon dioxide. Other types of insulating materials are also useful. Excess dielectric materials are then removed and polished to provide a planar top substrate surface.

In FIG. 2g, the substrate is processed to alter the stress property of the stress inducing layer. In one embodiment, the substrate is processed to convert the stress inducing layer with a neutral or low stress to having a high first stress. For example, the substrate is processed to convert the stress inducing layer to a high tensile stress layer. The processing, in one embodiment, comprises subjecting the substrate to ultraviolet (UV) treatment. The UV treatment is conducted, for example, at about 400-500° C. for about 10-15 mins. Alternatively, the processing comprises subjecting the substrate to a high temperature anneal (HTA), for example, at about 700-1000° C. for about 15 mins. In one embodiment, the HTA is conducted at about 1000° C. for about 15 mins.

Thereafter, processing of the substrate continues to form the IC. Such processing, for example, includes forming nFETs and pFETs in the first and second regions, forming other circuit components, interconnections, passivation, dicing, assembly and packaging.

Figure 3:
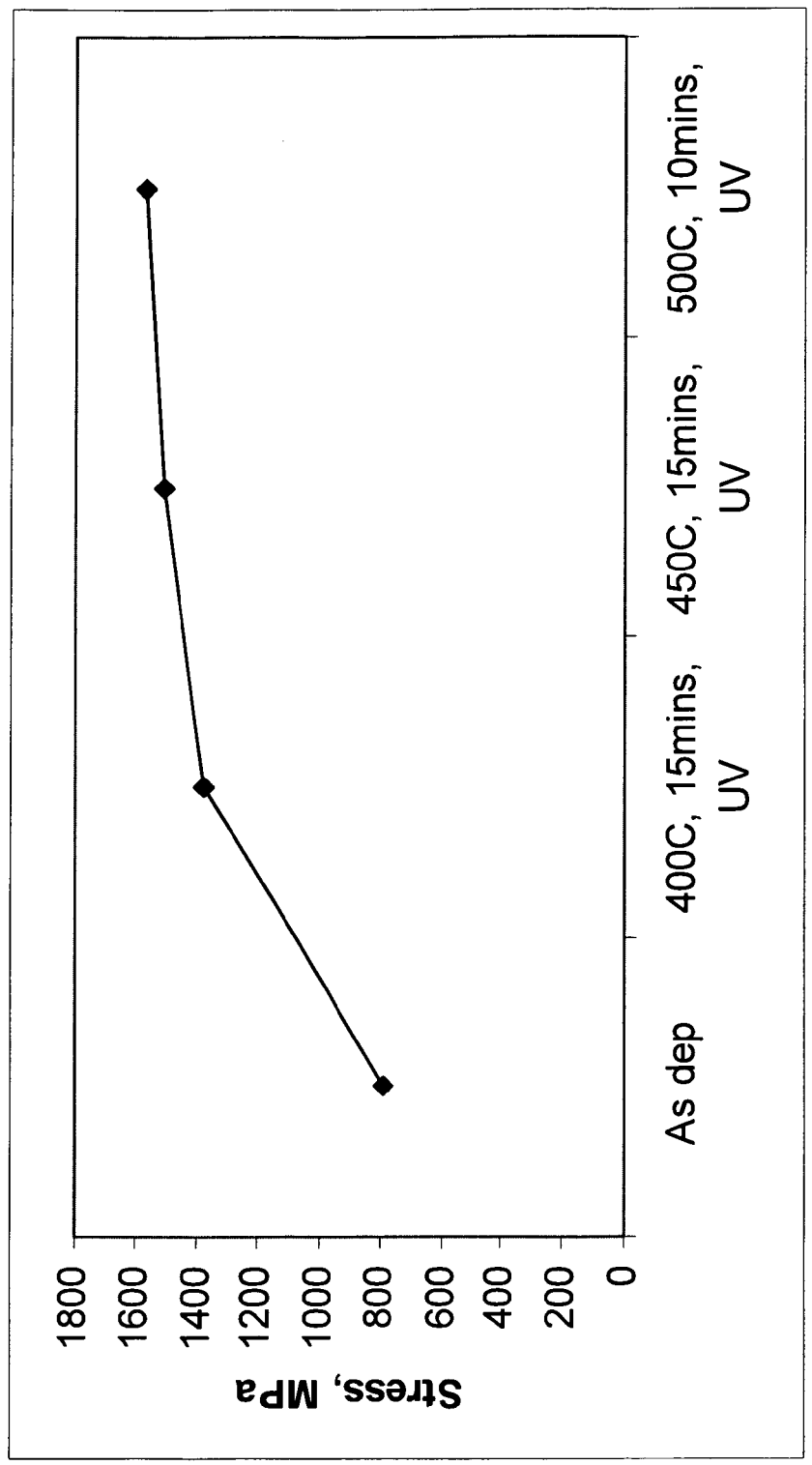
FIG. 3 shows the stress characteristics of an embedded stress layer following UV treatment.

An experiment was conducted to measure the effect of UV treatment on the stress characteristics of stress inducing layer in accordance with one embodiment of the invention. The stress inducing layer comprises silicon nitride. FIG. 3 plots the measurements of the experiments. As shown, the silicon nitride, as deposited on the substrate, has a low tensile stress of about 800 MPa. After UV treatment, the tensile stress increases significantly. For example, depending on the process parameters, the tensile stress increases to about 1400-1600 MPa.

In accordance with the invention, an embedded stress layer is incorporated in a hybrid orientation substrate to increase carrier mobility for improved device performance. Incorporation of the embedded stress layer provides an easy way to introduce stress in the hybrid orientation substrate. The embedded stress layer can be selectively provided in a region of the substrate having a first (or second) orientation to optimize the performance of specific devices. For instance, according to one embodiment of the invention, a tensile stress layer is incorporated in a region of the hybrid substrate having a (110) orientation to improve pFET performance. Introducing a compressive stress layer in a region of the substrate having a (001) orientation to enhance nFET performance is also contemplated and within the scope of the invention. Applying the stress to other orientated surface substrates is also useful.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of fabricating a hybrid orientation substrate comprising the steps of:
   providing a substrate comprising
      a first region; the first region having a first surface layer having a first substrate orientation,
      a second region; the second region having a second surface layer having a second substrate orientation, the first and second regions are electrically isolated by an isolation region,
      the second surface layer comprising a plurality of sub-layers over the second region, wherein the plurality of sub-layers comprise an upper sub-layer comprising a semiconductor material having a second crystal orientation over a lower sub-layer comprising a first and a second pad buried layers sandwiching a stress layer having a neutral or moderate tensile stress; and
   converting the stress layer to a high tensile stress layer, wherein converting the stress layer comprises subjecting the substrate to an ultra violet (UV) treatment.

2. The method of claim 1 wherein the first and second pad buried layers serve to improve adhesion between the stress layer and the substrate.

3. The method of claim 1 wherein the second pad buried layer serves as a buffer to avoid direct contact between the stress layer and the substrate.

4. A method of fabricating a hybrid orientation substrate comprising the steps of:
   providing a substrate comprising
      a first region; the first region having a first surface layer having a first substrate orientation,
      a second region; the second region having a second surface layer having a second substrate orientation, the first and second regions are electrically isolated by an isolation region,
      the second surface layer comprises a stress layer over the second region, wherein the stress layer is formed below a semiconductor material having a second crystal orientation and comprises a composite sub-layer having a plurality of buried layers, the stress layer having a neutral or moderate tensile stress; and
   subjecting the substrate to an ultra violet (UV) treatment to convert the stress layer to a high tensile stress layer.

5. The method of claim 4 wherein the UV treatment is conducted at about 400-500° C. for about 10-15 mins.

6. The method of claim 4 wherein the plurality of buried layers comprise a first pad buried layer and a second pad buried layer sandwiching the stress layer.

7. The method of claim 6 wherein the second pad buried layer serves as a buffer to avoid direct contact between the stress layer and the substrate.

8. The method of claim 1 wherein the UV treatment is conducted at about 400-500° C. for about 10-15 mins.

9. A method of fabricating a hybrid orientation substrate comprising the steps of:
   providing a surface substrate comprising
      a first region having a first layer with a first substrate orientation,
      a second region having a second layer with a second substrate orientation, the first and second regions are electrically isolated by an isolation region, wherein the second layer comprises a semiconductor material having a second crystal orientation formed over a stress layer comprising a composite layer having a plurality of buried layers, the stress layer having a neutral or moderate tensile stress over it;
   bonding the surface substrate to a base substrate, wherein the base substrate has the same substrate orientation as the first layer; and
   converting the stress layer of the second region to a high tensile stress layer, wherein converting the stress layer comprises subjecting the substrate to an ultra violet (UV) treatment.

10. The method of claim 9 wherein the stress layer comprises silicon nitride.

11. The method of claim 9 wherein the UV treatment is conducted at about 400-500° C. for about 10-15 mins.

12. The method of claim 9 wherein the second region comprises an upper or first sub-layer and a lower or second sub-layer.

13. The method of claim 12 wherein the lower or second sub-layer comprises the stress layer.

14. The method of claim 9 wherein the plurality of buried layers comprise a first pad buried layer and a second pad buried layer sandwiching the stress layer.

15. The method of claim 13 wherein the stress layer comprises a first stress which induces a second stress on the upper or first sub-layer.

16. The method of claim 15 wherein the stress layer comprises a tensile stress material which induces a compressive stress on the upper or first sub-layer.

* * * * *